United States Patent
Schreiber (10) Patent No.: US 11,356,093 B2
(45) Date of Patent: *Jun. 7, 2022

(54) EVEN/ODD DIE AWARE SIGNAL DISTRIBUTION IN STACKED DIE DEVICE

(71) Applicant: ADVANCED MICRO DEVICES, INC., Santa Clara, CA (US)

(72) Inventor: Russell Schreiber, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/817,976

(22) Filed: Mar. 13, 2020

(65) Prior Publication Data
US 2021/0067161 A1 Mar. 4, 2021

Related U.S. Application Data (63) Continuation of application No. 16/553,590, filed on Aug. 28, 2019, now Pat. No. 10,608,633.

(51) Int. Cl.
*H03K 19/00* (2006.01)
*H03K 19/0175* (2006.01)
*H04L 25/20* (2006.01)

(52) U.S. Cl.
CPC . *H03K 19/0002* (2013.01); *H03K 19/017509* (2013.01); *H03K 19/017545* (2013.01); *H03K 19/017581* (2013.01); *H04L 25/20* (2013.01)

(58) Field of Classification Search
None
See application file for complete search history.

(56) References Cited

U.S. PATENT DOCUMENTS

| | | | |
|---|---|---|---|
| 2009/0015291 A1* | 1/2009 | Kim | G11C 7/1045 326/52 |
| 2016/0372170 A1* | 12/2016 | Morohashi | G11C 7/1084 |
| 2018/0357156 A1* | 12/2018 | Narui | G11C 5/025 |

* cited by examiner

*Primary Examiner* — Anh Q Tran (57) ABSTRACT

An electronic device includes a die stack having a plurality of die. The die stack includes a die parity path spanning the plurality of die and configured to alternatingly identify each die as a first type or a second type. The die stack further includes an inter-die signal path spanning the plurality of die and configured to propagate an inter-die signal through the plurality of die, wherein the inter-die signal path is configured to invert a logic state of the inter-die signal between each die. Each die of the plurality of die includes signal formatting logic configured to selectively invert a logic state of the inter-die signal before providing it to other circuitry of the die responsive to whether the die is designated as the first type or the second type.

20 Claims, 3 Drawing Sheets

EVEN/ODD DIE AWARE SIGNAL DISTRIBUTION IN STACKED DIE DEVICE

CROSS-REFERENCE TO RELATED APPLICATIONS

The present application is a continuation application of U.S. patent application Ser. No. 16/553,590, entitled "EVEN/ODD DIE AWARE SIGNAL DISTRIBUTION IN A STACKED DEVICE" and filed on Aug. 28, 2019, the entirety of which is incorporated by reference herein.

BACKGROUND

Three-dimensional (3D) stacked devices employ a stack of dies, such as memory dies or logic dies, so as to provide low-latency connections between the dies, as well as a smaller footprint than typically would be required for a single layer approach. Signals often are distributed through the stack along an inter-die signal path, where logic at some or all of the dies use the signal as an input to circuitry local to that die. Typically, to maintain signal strength and quality, each die included in the inter-die signal path for the signal includes a local repeating amplifier (hereinafter, "repeater"). Typically, this repeater is either implemented as a single inverter or two inverters in sequence. A two-inverter implementation allows the signal being propagated between the dies to remain in the same logic state (e.g., high or low, or 0 or 1) between each die. That is, the signal has the same logic state going into a die as it has leaving the die. However, each inverter adds its own propagation delay, and thus each die transitioned by this signal along the inter-die signal path incurs a propagation delay that includes the switching delays of two inverters. A single-inverter implementation provides reduced propagation delay compared to a two-inverter approach, but results in the logic state of the propagating signal being inverted each time it transitions between dies; that is, the logic state of the signal entering one die is the opposite logic state of the signal entering the next die in the inter-die signal path. As such, each die must be informed of where it is positioned in the stack in order to process the signal correctly given that the logic state of the signal is dependent on the die position; that is, the parity of the die, i.e., whether the die is at an "even" position or an "odd" position within the stack.

One conventional approach to solving the even/odd positioning of a die in a single-inverter repeater implementation is to fabricate separate "even" dies and "odd" dies, such that an even die is hardwired to invert the state of an input inter-die signal before it is used by the circuitry local to the die, and an odd die is hardwired to provide an input inter-die signal without inversion to the circuitry local to the die. However, this approach prevents easy interchange of fabricated die, as well as requires pre-determination of where each die will be positioned within the stack prior to final assembly of the 3D stacked device. Solutions relying on fuses or other one-time-programmable elements to set the "even" or "odd" category for a die after fabrication suffer from the similar non-interchangeability issues. Another conventional approach to use a register or other re-programmable element to identify whether a given die is "even" or "odd" within a die stack. While this approach can facilitate interchangeability of a given die, the programming of such registers occurs at a late stage during the initiation process for a 3D stacked device, and thus prevents the use of propagated inter-die signals until the initiation process has completed, or nearly so.

BRIEF DESCRIPTION OF THE DRAWINGS

The present disclosure is better understood, and its numerous features and advantages made apparent to those skilled in the art by referencing the accompanying drawings. The use of the same reference symbols in different drawings indicates similar or identical items.

DETAILED DESCRIPTION

Figure 1:
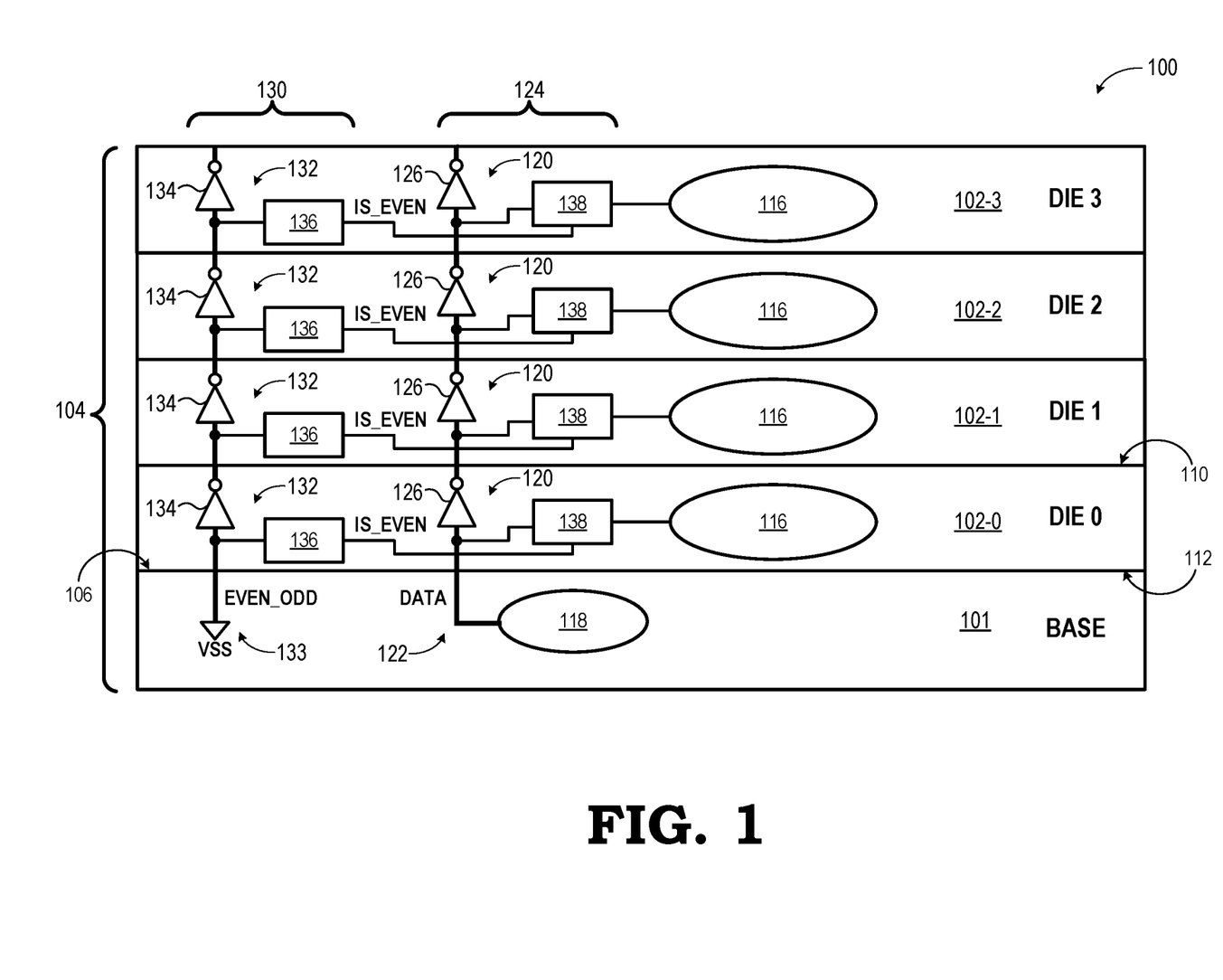
FIG. 1 is a diagram illustrating a side view of a 3D stacked electronic device having an asynchronous even/odd parity determination mechanism for a stack of dies in accordance with some embodiments.
Figure 2:
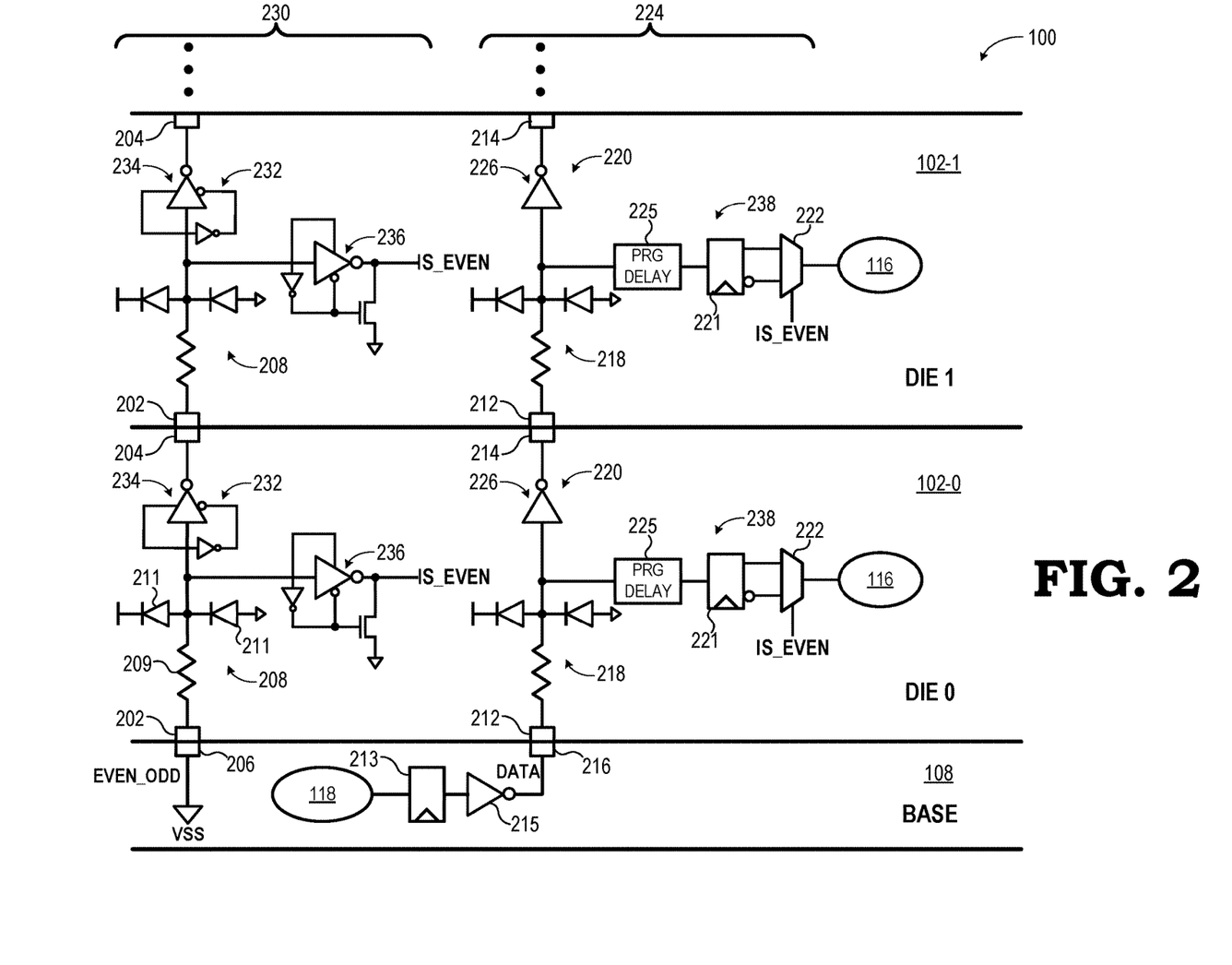
FIG. 2 is a diagram illustrating an example circuit implementation for the asynchronous even/odd parity determination mechanism of FIG. 1 and an accompanying inter-die signal path in accordance with some embodiments.
Figure 3:
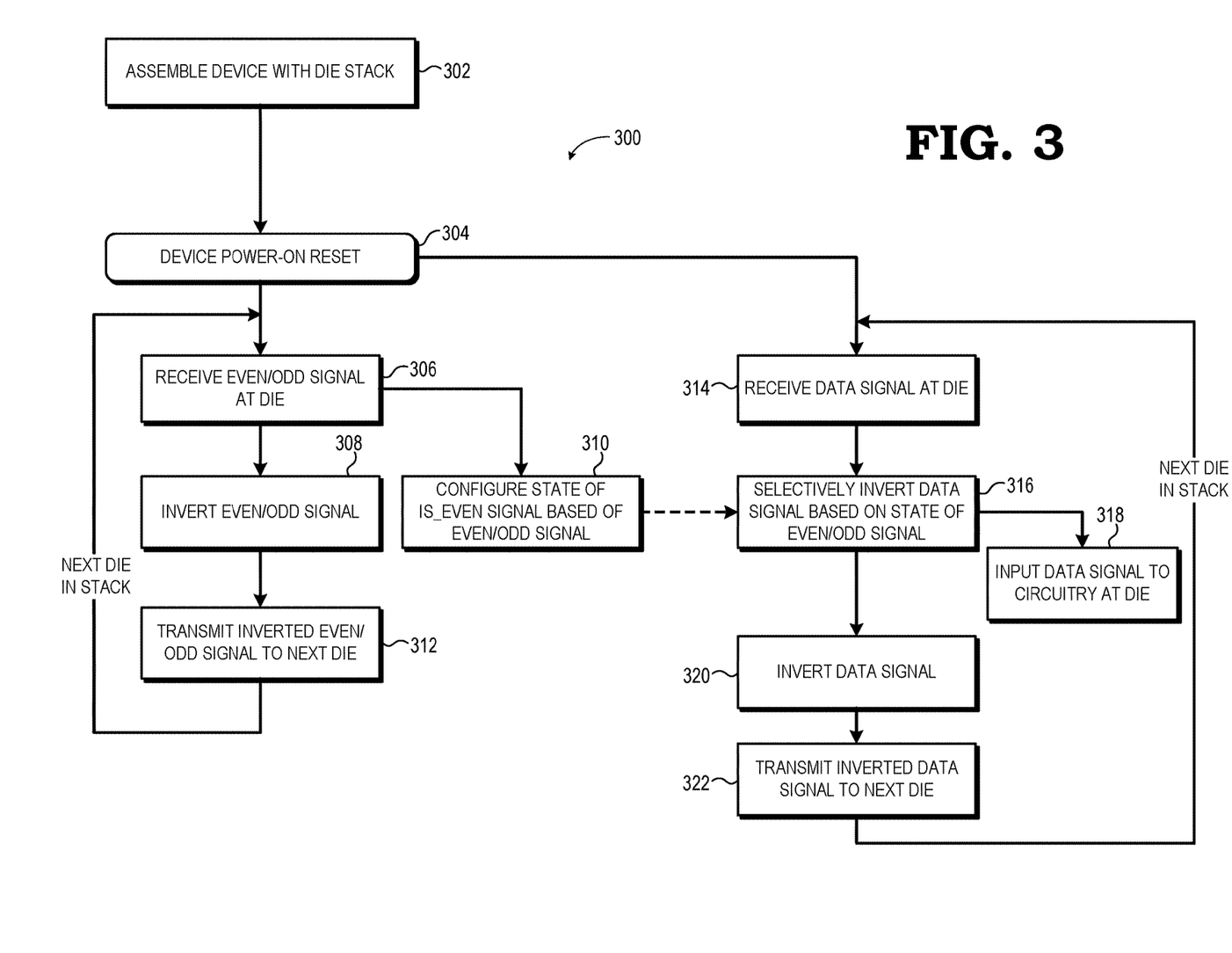
FIG. 3 is a flow diagram illustrating a method for processing the inter-die signal propagated in a stack of dies using the asynchronous even/odd parity determination mechanism of FIGS. 1 and 2 in accordance with some embodiments.

FIGS. 1-3 illustrate devices and techniques for asynchronous die parity determination in a 3D stacked die device so as to facilitate accurate processing of signals propagated through the stacked dies of the device. In at least one embodiment, an electronic device includes a die stack having a plurality of die. The die stack includes a die parity path spanning the plurality of die and configured to alternatingly identify each die as a first type or a second type. The die stack further includes an inter-die signal path spanning the plurality of die and configured to propagate an inter-die signal through the plurality of die, wherein the inter-die signal path is configured to invert a logic state of the inter-die signal between each die. Each die of the plurality of die includes signal formatting logic configured to selectively invert a logic state of the inter-die signal before providing it to other circuitry of the die responsive to whether the die is designated as the first type or the second type. In another embodiment, a method for propagating an inter-die signal through a stack of dies includes propagating a die parity signal through each die of the stack, wherein each die inverts a logic state of the die parity signal as received at the die before providing the die parity signal with the inverted logic state to the next die in the stack. The method also includes propagating the inter-die signal through the stack, wherein each die inverts a logic state of the inter-die signal as received at the die before providing the inter-die signal with the inverted logic state to the next die in the stack. The method additionally includes, at each die of the stack, selectively inverting a logic state of the inter-die signal as received at the die before providing the inter-die signal for use by circuitry of the die, wherein the logic state is selectively inverted based on a logic state of the die parity signal as received at the die.

It is noted that orientation terms, such as "top", "bottom", "vertical", and the like, are used herein for ease of reference, and do not imply a particular orientation with respect to gravity, but rather to the particular view represented in the figure being described.

FIG. 1 illustrates an electronic device 100 employing asynchronous stacked die parity determination in accordance with some embodiments. The electronic device 100 includes a plurality of die (such as the example base die 101 and four die 102, numbered 102-0, 102-1, 102-2, 102-3, to be identified as even/odd relative to the base die 101) assembled in a stack 104 such that, with the exception of the first die 102 in the stack 104 (e.g., die 102-0), each die at least partially overlaps with the die below it in the stack 104. The stack 104 itself is assembled into an integrated circuit (IC) package that then can be mounted on a motherboard or other type of printed circuit board (PBC) or other type of substrate used for mounting stacked die packages. The die 101 includes a top surface 106 facing the die 102 of the stack 104, and each die 102 includes a top surface 110 and an opposing bottom surface 112, with the bottom surface 112 of each die 102 at least partially overlapping either the top surface 110 of the previous die 102 in the stack 104, or in the case of the bottom die 102-0 in the stack 104, the top surface 106 of the base die 101. As noted above, the orientation designators "top" and "bottom", with respect to surfaces 106, 110, and 112, refer solely to the orientation of these surfaces relative to the cross-section side view presented by FIG. 1 and are not intended to identify or indicate which surfaces of the die contain the active circuitry of the die. Each of the top surface 110 and the bottom surface 112 of the die 102 includes a respective array of conductive interconnects (not shown in FIG. 1), to facilitate mechanical and electrical coupling of the bottom surface 112 of one die 102 to the top surface 110 of the previous die 102 in the stack 104, or, in the case of the bottom die 102-0, to the top surface 106 of the base die 101. In some embodiments, the coupling of the dies 101, 102 of the stack 104 is achieved via any of a variety of bumpless interconnect techniques. In other embodiments, the conductive interconnects between the die are achieved via a corresponding solder ball, bump, microbump, pin, stud, a bumpless interconnect, or other conductive structure for joining two opposing conductive interfaces as known in the art.

Each of the die 102 includes corresponding circuitry 116 having analog circuit components, digital circuit components, or a combination thereof, to perform various functions. The die 101 likewise includes circuitry 118 having circuit components to perform various function. For example, the base die 101 can include a central processing unit (CPU) chip implementing one or more CPU cores, while each of the die 102-0 to 102-3 includes a memory die having random access memory (RAM)(one example of the circuitry 116) to store data for use by the CPU cores. As another example, the base die 101 can include a CPU and each of the die 102-0 to 102-3 is a graphics processing unit (GPU) chip implementing one or more GPU cores (another example of the circuitry 116).

Typically, the design of the electronic device 100 is such that various signals are communicated among the base die 101 and the die 102, including signals propagated from the base die 101 through each of the die 102 (or at least through a subset of each of the die 102), signals propagated through each of the die 102 to the base die 101, or signals propagated from one die 102 in the stack 104 to at least two other die 102 "above" or "below" the source die 102 in the stack 104. Such a signal is referred to herein as an "inter-die signal." The one or more inter-die signals propagated through the stack 104 can include data signals, control signals, clock signals, or a combination thereof. For example, a differential pair of inter-die signals can propagated so as to provide a differential serial transmission link, a set of two or more single-ended signals or two or more differential pairs of signals can be propagated so as to provide a parallel transmission link, and the like. In the following description, and implementation in which a single inter-die signal propagating from circuitry 118 of the base die 101 through each of the die 102-0 to 102-3 in sequence as a data signal (labeled "DATA") is depicted and described. However, the guidelines and techniques described herein also can be equally employed for propagation of inter-die signals in the opposite direction, inter-die signals between a different subset of the die 101, 102, and the like.

To facilitate propagation of the inter-die data signal DATA from the circuitry 118 of the base die 101, each die 102 in the stack 104 implements a signal path segment 120 that, when the stack 104 is assembled, is electrically connected to the signal path segment 120 of the preceding die 102 (if any) and the next die 102 (if any) in the stack 104, and for the first die 102-0 in the stack 104, connected to a corresponding signal path segment 122 in the base die 101. The signal path segment 122, the sequence of signal path segments 120, and any conductive interconnects between the die that connect these segments together form an inter-die signal path 124 for propagating the inter-die signal DATA from the base die 101 through the die 102 of the stack 104.

One purpose of each signal path segment 120 is to receive the inter-die signal DATA from the signal path segment 120 of the previous die 102 in the stack 104 (or from the signal path segment 122 of the base die 101 in the case of die 102-0) and to ensure propagation of the inter-die signal to the signal path segment 120 of the next die 102 in the stack 104 with sufficient signal strength and signal quality. Accordingly, each of the signal path segments 120 includes a conductive interface at the bottom surface 112 of the corresponding die, a conductive interface at the top surface 110 of the corresponding die, and a repeater 126 in the signal path connecting these two opposing interfaces. The conductive interfaces can include, for example, conductive pads in implementations using bumps or microbumps or other external conductive structures, or the termination of an electrode (e.g., a through silicon via (TSV)) at the surface of the die in implementations using bumpless interconnects. The repeater 126 includes an input coupled to the conductive interface at the bottom surface 112 via one or more conductive structures, such as TSVs, vias, traces, and the like, and an output coupled to the conductive interface at the top surface 110. As such, the conductive interface at the bottom surface 112 operates as an input for the signal path segment 120 and the conductive interface at the top surface 110 operates as an output for the signal path segment 120. Thus, the input of the signal path segment 120 of one die 102 thus is electrically connected to the output of the signal path segment 120 of a previous die 102 via a corresponding conductive interconnect formed by the paired conductive interfaces disposed therebetween (with the exception of the signal path segment 120 of the first die 102-0, which has its input coupled to the signal path segment 122 of the base die 101). Likewise, the output of the signal path segment 120 of one die 102 is electrically connected to the input of the signal path segment 120 of the next die 102 via a corresponding conductive interconnect therebetween (with the exception of the output of the signal path segment 120 of the last die 102-3). With this configuration, the repeater 126 of each signal path segment 120 operates to drive the inter-die signal DATA received at the input of the signal path segment 120 to the output of the signal path segment 120, and thus propagate the inter-die signal DATA from the circuitry 118 of the base die 101 through each of the die 102-0 to 102-3 of the stack 104 in turn via the inter-die signal path 124.

The repeater 126 operates to reform the inter-die signal DATA between input and output at the corresponding die 102 thus assists in providing sufficient signal quality and strength to the inter-die signal DATA as it propagates through the inter-die signal path 124. However, such repeaters are typically implemented with transistors or other active circuit components and thus introduce a delay reflective of the gate switching times of the active circuit components. This delay is additive as the inter-die signal propagates along the inter-die signal path 124. Accordingly, to mitigate the impact of repeater delay on propagation of the inter-die signal DATA, in at least one embodiment the repeater 126 of each signal path segment 120 employs only one inverter (in which case the repeater 126 is also referred to herein as "inverter 126"), in the signal path between the input and the output of the signal path segment 120. Under this approach, the delay introduced by the signal path segment 120 is subject to only one inverter logic delay, as opposed to the two inverter logic delay that would be introduced by a repeater implemented as a series of two inverters. However, this also means that because only a single inverter is used, the logic state of the inter-die signal DATA is inverted, or "flipped" between the input and the output of each signal path segment 120. Thus, if the inter-die signal DATA has a logic state of "0" going into die 102-0, then the die 102-0 inverts the inter-die signal DATA so as to have a logic state of "1" when the inter-die signal DATA is provided to the die 102-1. The die 102-1 thus receives the inter-die signal DATA having the logic state of "1" and then inverts the logic state back to "0" and provides the inter-die signal DATA with the logic state of "0" to the die 102-2, and so on.

Besides acting to propagate the inter-die signal DATA itself, the signal path segment 120 at each die 102 also serves as the source for distribution of the inter-die signal DATA to the circuitry 116 of that die 102. However, due to the logic state inverting operation of the single-inverter implementation of the repeater 126, the logic state of the inter-die signal DATA as received at the die 102 is either inverted or non-inverted relative to its original logic state, depending on where that die 102 lies in the sequence of dies 102 in the stack 104. As such, in at least one embodiment, the logic state of the inter-die signal DATA is selectively inverted before the inter-die signal DATA is provided to the circuitry 116, with the "decision" of whether to invert the inter-die signal DATA before transmission to the circuitry 116 or maintaining the current logic state of the inter-die signal DATA is dependent on determination of whether the die 102 is receiving the original logic state or an inverted logic state of the inter-die signal DATA.

To facilitate this identification, in at least one embodiment the die 101, 102 of the stack 104 together implement a die parity determination path 130 that operates to propagate a die parity signal (labeled "EVEN_ODD") that is used to identify, at each die 102, the parity of that die; that is, whether that die 102 is a first type or a second type, referred to herein as "even" type and "odd" type, respectively. As used herein, a die 102 of even type indicates that the die 102 is positioned in the stack 104 and thus in the inter-die signal path 124 such that the die 102 will receive the inter-die signal DATA in its original, or non-inverted, logic state whereas a die 102 of odd type indicates that the die 102 is positioned in the stack 104 and thus in the inter-die signal path 124 such that the die 102 will receive the inter-die signal DATA in its inverted logic state. For example, assuming the inter-die signal DATA is output from the base die 101 in its non-inverted form, the die 102-0 and 102-2 receive the inter-die signal DATA in a non-inverted logic state and thus these die are even-type die, whereas the die 102-1 and 102-3 receive the inter-die signal DATA in an inverted logic state and thus these data are odd-type die.

The die parity path 130 is composed of a parity path segment 132 at each die 102, as well as a parity path segment 133 at the base die 101. The parity path segment 132 includes one or more active or passive circuit components or conductive components configured to couple to a fixed voltage reference (e.g., ground or Vss) so as to output a fixed logic state (e.g., "0") as the original logic state of the die parity signal EVEN_ODD to the parity path segment 132 of the first die 102-0 in the stack 104. Each parity path segment 132 of a die 102 includes an input composed of a conductive interface at the bottom surface 112 of the die 102 and an output composed of a conductive interface at the top surface 110 of the die. The input is coupled to the output of the parity path segment 132 of the previous die 102 in the stack 104 (or to the output of the parity path segment 133 of the base die 101 in the case of the first die 102-0). Further, a single inverter 134 is implemented in the signal path between the input and the output of the parity path segment 132 such that the logic state of the die parity signal EVEN_ODD as received at the input of one die is then inverted for output of the die parity signal EVEN_ODD to the next die.

In this manner, the inverted/non-inverted state of the die parity signal EVEN_ODD at each die 102 mirrors the inverted/non-inverted state of the inter-die signal DATA at each die 102. However, as the original logic state of the die parity signal EVEN_ODD is specified and fixed as the logic state represented by the reference voltage to which the parity path segment 133 is tied, the logic state of the die parity signal EVEN_ODD as received at the parity path segment 132 of a given die 102 is indicative of whether that die 102 is even type or odd type. For example, assuming the die parity signal EVEN_ODD is tied to Vss and thus has an original logic state of "0", any die 102 receiving the die parity signal EVEN_ODD with logic state "0" (e.g., die 102-0 and 102-2 in this example) is determined to have a parity type "even"; that is, a die of even type and identifiable as such at the die itself, whereas any die 102 receiving the die parity signal EVEN_ODD with logic state "1" (e.g., die 102-1 and 102-3 in this example) is determined to have a parity type "odd", that is, a die of odd type and identifiable as such at the die itself.

Accordingly, the parity path segment 132 of each die 102 includes parity determination logic 136 having an input coupled to the input of the parity path segment 132 to receive the die parity signal EVEN_ODD with its logic state as received at the die 102, and having an output to provide a signal labeled IS_EVEN, wherein the parity determination logic 136 operates to configure the logic state of the signal IS_EVEN to reflect the particular even/odd type of the die 102 based on the logic state of the die parity signal EVEN_ODD as received at the input of the parity determination logic 136. As described in greater detail below, in one embodiment, the parity determination logic 136 includes an inverter such that the provided signal IS_EVEN has a logic state that is the opposite of the logic state of die parity signal EVEN_ODD as received at the input to the die 102. Thus, in the example of the original logic state of the die parity signal EVEN_ODD being "0", the signal IS_EVEN is asserted, or configured to a logic state "1" for die 102-0 and 102-2 and unasserted, or configured to a logic state "0" for die 102-1 and 102-3, and thus identifying die 102-0 and 102-2 as die of even type and die 102-1 and 102-3 as die of odd type.

To provide selective inversion of the inter-die signal DATA based on type, in at least one embodiment each die 102 includes signal formatting logic 138 having an input coupled to the output of the parity determination logic 136 of that die to receive the signal IS_EVEN and an output coupled to the circuitry 116 of the die 102 to provide a representation of the inter-die signal DATA in its original logic state for use by one or more components of the circuitry 116. The signal formatting logic 138 thus is operable to provide a representation of the inter-die signal DATA with the same logic state as received at the signal path segment 120 of the die 102 responsive to the signal IS_EVEN being asserted (that is, having a logic state representing or identifying the die 102 as a die of even type), and to provide a representation of the inter-die signal DATA with the opposite logic state as received at the signal path segment 120 of the die 102 (that is, to invert the received inter-die signal DATA before providing the inverted signal to the circuitry 116) responsive to the signal IS_EVEN being unasserted (that is, having a logic state representing or identifying the die 102 as a die of odd type).

The approach represented in FIG. 1 permits rapid propagation of the inter-die signal DATA by using only a single-inverter repeater for driving the signal at each die 102, in that the die parity determination mechanism implemented by the die parity path 130 allows each die 102 to identify whether it is an even-type die or odd-type die and thus invert, or refrain from inverting, the logic state of the inter-die signal DATA as received at the die according to the die's identified type. Moreover, because the die parity determination mechanism relies on a hard-wired input to a fixed reference voltage, the die-by-die parity determination process occurs sufficiently rapidly after power-on reset (POR) or other initiation of the electronic device 100. This rapid and asynchronous die parity determination allows the circuitry 116 at each die 102 to begin using the inter-die signal DATA with its original logic state shortly after device initiation, as opposed to register-based techniques that require a device to be considerably further along in its initiation process before the die can be correctly typed as even or odd. Moreover, as demonstrated above, the internal circuit configuration for each die 102 remains the same regardless of whether the die 102 is even or odd within the stack 104. As such, a given die 102 can be implemented at either an even position or odd position in the stack 104 without any pre-configuration, and thus a manufacturer of the device 100 is not required to bin or categorize or track die as one type or the other prior to the assembly process, unlike conventional fuse-based parity approaches.

FIG. 2 illustrates a more-detailed circuit implementation for the electronic device 100 in accordance with some embodiments. For ease of illustration, only die 102-0 and 102-1 of stack 104 are illustrated, but it would be understood that the omitted die 102-2 and 102-3 would be configured in a similar manner. As shown, each parity path segment 232 (one embodiment of parity path segment 132) of a die parity path 230 (one embodiment of the die parity path 130) includes conductive interfaces 202 and 204 (e.g., pads or terminations of electrodes) at the bottom surface 112 and top surface 110, respectively, of the corresponding die 102 that serve as the input and output (respectively) for the parity path segment 232. The conductive interface 202 of one die 102 is electrically and mechanically connected to the conductive interface 204 of the previous die 102 in the stack, either through a bumpless interconnect or via a bump-based interconnect, with the exception of the conductive interface 202 of the first die 102-0, which is instead electrically and mechanically coupled to a corresponding conductive interface 206 of the base die 101. The conductive interface 206 in turn is tied to Vss or another voltage reference.

In one embodiment, the parity path segment 232 includes an electrostatic discharge (ESD) circuit 208 coupled to the conductive interface 202 (that is, the input), such as the illustrated configuration of a resistor 209 and diodes 211. The inverter 234 of the parity path segment 232 is implemented as a tristate inverter 234 having an input coupled to the conductive interface 202 and an inverted output coupled to the conductive interface 204 of the corresponding die 102. Further, in the illustrated embodiment the parity determination logic 136 (FIG. 1) of the parity path segment 232 is implemented as a tristate inverter 236 with pulldown on its output to drive a known value into downstream logic and having an input coupled to the input of the tristate inverter 234 and an inverted output to provide the signal IS_EVEN for that die 102. In this instance, tristate inverters are employed so as to avoid having a short circuit current path through both the n-type and p-type transistors in the event that the input is not driven, such as during a probe test. Thus, in this configuration, the die parity signal ODD/EVEN has a logic state of "0" as received at the input to the even-type die and a logic state of "1" as received at the input to the odd-type die, and thus logic state of the signal IS_EVEN is set to "1" at the even-type die and set to "0" at odd-type die.

In the illustrated embodiment, each signal path segment 220 (one embodiment of signal path segment 120) of an inter-die signal path 224 (one embodiment of inter-die signal path 124) includes conductive interfaces 212 and 214 at the bottom surface 112 and top surface 110 (see FIG. 1), respectively, of the corresponding die 102 that serve as the input and output (respectively) for the signal path segment 220. The conductive interface 212 of one die 102 is electrically and mechanically connected to the conductive interface 214 of the previous die 102 in the stack, with the exception of the conductive interface 212 of the first die 102-0, which is instead electrically and mechanically coupled to a corresponding conductive interface 216 of the base die 101. The conductive interface 216 in turn is used to output the inter-die signal DATA to the first die 102-0 from the circuitry 118 of the base die 101 via, for example, a flip-flop 213 and an inverter 215 as shown.

In one embodiment, the signal path segment 220 includes an electrostatic discharge (ESD) circuit 218 coupled to the conductive interface 212 (that is, the input), and is configured similarly to the ESD circuit 208. The repeater 126 (FIG. 1) of the signal path segment is implemented in one embodiment as a tristate inverter 226 having an input coupled to the conductive interface 212 and an inverted output coupled to the conductive interface 214 of the corresponding die 102. In the illustrated embodiment the signal formatting logic 238 (one embodiment of the signal formatting logic 138) of the signal path segment 220 is implemented as flip flop 221 and a multiplexer 222. The flip flop 221 has an input to receive a representation of the inter-die signal DATA as received at the conductive interface 212 and two outputs: one output to provide the representation of the inter-die signal DATA with the same logic state as received at the input, and one output to provide the representation of the inter-die signal DATA with the inverse logic state as that received at the input. The multiplexer 222 has two inputs coupled to the two outputs of the flip flop 221, a select input coupled to the inverted output of the tristate inverter 236 to receive the signal IS_EVEN, and an output coupled to the circuitry 116 of the die 102 and configured to provide a select one of the inter-die signal DATA with the same logic state as received at the die 102 or with the opposite logic state, based on the state of the signal IS_EVEN, to the circuitry 116. Thus, the flip flop 221 and multiplexer 222 together operate to selectively invert the logic state of the inter-die signal DATA as input to the die 102 based on whether the signal IS_EVEN indicates that the die 102 is an even-type die or an odd-type die. In this configuration, even-type dies 102 thus would not invert the logic state of the received inter-die signal DATA as its logic state matches the original logic state of the signal as provided to the stack 104, whereas odd-type dies 102 would invert the logic state of the received-inter die signal data as the logic state of the received signal at the odd-type die is the opposite of the original logic state.

The use of tristate inverters 226, 234, 236 allows the inputs to the die 102 as represented by the conductive interfaces 202 and 212 for the paths 224, 230, respectively, to prevent a short circuit between power and ground when their inputs are floating. As such, when the die 102 is subject to a probe test during wafer testing or after die singulation the circuitry of the die connected to these inputs do not go into high current states.

It will be appreciated that each signal path segment 220 introduces a delay representative of the single inverter 226 in the path between the input interface 212 and the output interface 214, and this delay is cumulative as the inter-die signal DATA propagates up through the stack 104. As such, if the delay introduced by each die is X, die 102-1 receives the inter-die signal DATA with a 1× delay, die 102-2 receives the inter-die signal DATA with a 2× delay, die 102-3 receives the inter-die signal DATA with a 3× delay, and so on. Thus, to help ensure that the representations of the inter-die signal DATA as provided to the circuitry 116 of each die 102 are substantially aligned across the stack 104, in at least one embodiment the signal formatting logic 238 of each signal path segment 120 further includes a programmable delay circuit 225 having an input coupled to the input of the tristate inverter 226 and an output coupled to the input of the flip-flop 221, wherein the programmable delay circuit 225 is configured to introduce a programmable delay into the representation of the inter-die signal DATA provided from the interface 212 to the input of the flip flop 221. Any of a variety of programmable delay circuits can be implemented. For example, in one embodiment, the programmable delay circuit includes a plurality of inverter strings, each inverter string having an input coupled to the input of the tristate inverter 226, an output coupled to a multiplexer, and with a different number of inverters in each inverter string, and the delay being programmable by configuring the multiplexer to select a the signal from a particular inverter string for output. The programmable delay circuit 225 of each die 102 is thus programmed with a delay representative of that die's position in the stack 104 such that the first die 102-0 has the largest introduced delay and the last die 102-3 has the smallest introduced delay (or no delay) such that the output of the inter-die signal DATA to the circuitry 116 of each die 102 is approximately aligned across all of the die 102 of the stack 104. Further, in some embodiments, the programmable delay circuit 225 implements a mechanism for preventing a short circuit current path in the event that the input is undriven, such as at probe test.

FIG. 3 illustrates a method 300 of assembly and operation of the electronic device 100 in accordance with some embodiments. At block 302, the electronic device 100 is fabricated by assembling the stack 104 via stacking and mechanical and electrical coupling of conductive interfaces of each die 101, 102 with the corresponding interfaces of the preceding die in the stack 104. As described above, because the parity path segment 132 and the signal path segment 120 is the same for each die 102, the manufacturer does not need to bin or categorize any given die 102 as an even or odd die so as to particularly select where the die 102 is to be positioned in the stack 104, but instead selects the necessary number of die 102 without differentiation and assemble them in any given order in the stack 104. The stack 104 is then mounted to another package or other substrate, which then is mounted on a PCB or otherwise connected to various inputs, outputs, and power supplies of any overall system that incorporates the electronic device 100.

At some later point, the electronic device 100 is subjected to a POR or otherwise begins initialization for operation at block 304. As a result, the die parity path 130 is coupled to the reference voltage (Vss in this example) and the circuitry 118 of the base die 101 initiates transmission of the inter-die signal DATA, and thus initiating the propagation of the die parity signal EVEN_ODD and the inter-die signal DATA through the die 102 via the die parity path 130 and the inter-die signal path 124, respectively.

For the propagation of the die parity signal EVEN_ODD, at block 306 the die parity signal EVEN_ODD is input to the conductive interface 202 of the parity path segment 132 of the next die 102 in sequence (or first die 102-0). At block 308, the parity determination logic 136 configures the state of the signal IS_EVEN generated at the current die 102 based on the logic state of the die parity signal EVEN_ODD as received at the die 102, such as, for example, by setting the signal IS_EVEN to "1" if the logic state of the received die distribution signal EVEN_ODD is "0", or vice versa. At block 310 the single inverter 134 inverts the logic state of the received die parity signal EVEN_ODD and at block 312 the parity path segment 132 of the die 102 provides the inverted die parity signal EVEN_ODD to the conductive interface 204 for transmission to the input interface 202 of the next die 102 in the stack 104. The process of blocks 306, 308, 310, and 312 is repeated for each die 102 in the stack 104 sequentially (with the transmission process of block 312 being uncompleted for the last die 102-3 in the stack 104).

For the concurrent propagation of the inter-die signal DATA, at block 314 the inter-die signal DATA is input to the conductive interface 212 of the signal path segment 120 of the next die 102 in sequence (or first die 102-0). At block 316, the signal formatting logic 138 selectively inverts the logic state of the inter-die signal DATA as received at the current die 102 based on the state of the signal IS_EVEN at the current die 102 and at block 318 the signal formatting logic 138 provides a representation of the selectively inverted inter-die signal DATA (e.g., a version with some amount of programmable delay) to the circuitry 116 of the current die 102. For example, if the signal IS_EVEN has a logic state of "1", thereby indicating the die 102 is an even-type die, then the signal formatting logic 138 refrains from inverting the received inter-die signal DATA, whereas if the signal IS_EVEN has a logic state of "0", thereby indicating the die 102 is an odd-type die, then the signal formatting logic 138 inverts the received inter-die signal DATA. Concurrently, at block 320 the single inverter 126 inverts the logic state of the received inter-die signal DATA and at block 322 the signal path segment 120 of the die 102 provides the inverted inter-die signal DATA to the conductive interface 214 for transmission to the input interface 212 of the next die 102 in the stack 104. The process of blocks 314, 316, 318, 320, and 322 is repeated for each die 102 in the stack 104 sequentially (with the transmission process of block 312 being uncompleted for the last die 102-3 in the stack 104).

In some embodiments, the devices and techniques described above are implemented in a system including one or more integrated circuit (IC) devices (also referred to as integrated circuit packages or microchips), such as the electronic device 100 described above with reference to FIGS. 1-3. Electronic design automation (EDA) and computer aided design (CAD) software tools typically are used in the design and fabrication of these IC devices. These design tools typically are represented as one or more software programs. The one or more software programs include code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device is stored in and accessed from the same computer readable storage medium or a different computer readable storage medium.

A computer readable storage medium includes any non-transitory storage medium, or combination of non-transitory storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium, in some embodiments, is embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above are implemented by one or more processors of a processing system executing software. The software includes one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium are implemented in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. An electronic device comprising:
   a die stack comprising a plurality of die, the die stack including:
      a die parity path spanning the plurality of die, the die parity path configured to alternatingly identify each die as a first type or a second type.

2. The electronic device of claim 1, wherein each die of the plurality of die includes signal formatting logic configured to selectively invert a logic state of a signal provided to circuitry of the die responsive to whether the die is designated as the first type or the second type.

3. The electronic device of claim 2, wherein each die includes an input coupled to a previous die in the die stack and an output coupled to a next die in the die stack, and wherein the signal is received via the input and a representation of the signal with an inverted logic state is provided to the output.

4. The electronic device of claim 1, wherein each die of at least a subset of the plurality of die includes for the die parity path:
   a first input configured to receive a die parity signal from another die of the plurality of die;
   a first output coupled to a first input of a next die;
   a single inverter disposed along a signal path between the first input and the first output, the single inverter configured to invert a logic state of the die parity signal as received at the first input and to provide the die parity signal with the inverted logic state to the first output; and
   parity determination logic having an input coupled to the first input and an output to provide a type signal having a logic state based on the logic state of the die parity signal as received at the first input, wherein the logic state of the type signal identifies the die as either the first type or the second type.

5. The electronic device of claim 4, wherein the parity determination logic comprises:
   an inverter having an input coupled to the first input to receive the die parity signal and an output to provide the type signal as an inverted representation of a logic state of the die parity signal as received at the first input.

6. The electronic device of claim 4, wherein:

the die stack further comprises an inter-die signal path spanning the plurality of die and configured to propagate an inter-die signal through the plurality of die, wherein the inter-die signal path is configured to invert a logic state of the inter-die signal between each die, and wherein each die of the plurality of die includes for the inter-die signal path:
- a second input configured to receive the inter-die signal from a previous die in the die stack;
- a second output coupled to the second input of a next die; and
- a single inverter disposed along a signal path between the second input and the second output, the single inverter configured to invert the logic state of the inter-die signal as received at the second input and to provide the inter-die signal with the inverted logic state to the second output.

7. The electronic device of claim 6, wherein:

each die of the plurality of die includes signal formatting logic configured to selectively invert a logic state of the inter-die signal responsive to whether the die is designated as the first type or the second type, the signal formatting logic including:
- a third input configured to receive a representation of the inter-die signal as received at the second input of the die; and
- a multiplexer having a first input to receive the representation of the inter-die signal, a second input to receive an inverted representation of the inter-die signal, an output coupled to circuitry of the die, and a select input coupled to the output of the parity determination logic of the die, wherein the multiplexer is configured to output one of the representation of the inter-die signal or the inverted representation of the inter-die signal to the output of the multiplexer responsive to the logic state of the type signal.

8. The electronic device of claim 7, wherein the signal formatting logic at each die further includes:
- a programmable delay circuit having an input coupled to the second input to receive the inter-die signal and an output coupled to the third input, wherein the programmable delay circuit is configured to provide the representation of the inter-die signal to the third input with an introduced programmable delay, and wherein the introduced programmable delay is based on a position of the die within the die stack; and
- a flip flop having an input coupled to the third input, a first output coupled to the first input of the multiplexer and configured to provide the representation of the inter-die signal to the multiplexer, and a second output coupled to the second input of the multiplexer and configured to provide the inverted representation of the inter-die signal to the multiplexer.

9. The electronic device of claim 7, wherein the die stack further comprises:

a base die preceding the plurality of die in the die stack, the base die comprising:
- circuitry coupled to the second input of the die of the plurality of die that is adjacent to the base die and configured to provide the inter-die signal; and
- an output coupled to the first input of the die of the plurality of die that is adjacent to the base die and configured to provide the die parity signal with a fixed logic state tied to a reference voltage.

10. A method for propagating an inter-die signal through a stack of dies, the method comprising:

propagating a die parity signal through each die of the stack, wherein each die inverts a logic state of the die parity signal as received at the die before providing the die parity signal with the inverted logic state to the next die in the stack; and at each die of the stack, selectively inverting a logic state of a signal before providing the signal for use by circuitry of the die, wherein the logic state is selectively inverted based on a logic state of the die parity signal as received at the die.

11. The method of claim 10, wherein for each die:

propagating the die parity signal comprises transmitting the die parity signal received at a first input of the die to a first output of the die through a single inverter, the first output coupled to the first input of a next die in the stack; and selectively inverting the logic state of the signal comprises:
- maintaining the logic state of the signal responsive to the die parity signal received at the die having a first logic state; and
- inverting the logic state of the signal responsive to the die parity signal received at the die having a second logic state opposite the first logic state.

12. The method of claim 11, further comprising:

propagating an inter-die signal through the stack, wherein each die inverts a logic state of the inter-die signal as received at the die before providing the inter-die signal with the inverted logic state to the next die in the stack; and wherein the signal provided for use by circuitry of the die comprises a selectively-inverted representation of the inter-die signal as received at the die.

13. The method of claim 12, wherein:

propagating the inter-die signal comprises transmitting the inter-die signal received at a second input of the die to a second output of the die through a single inverter, the second output coupled to the second input of a next die in the stack.

14. The method of claim 12, further comprising:

at each die of the stack, introducing a delay into the inter-die signal provided for use by the circuitry of the die, wherein the delay is programmable based on a position of the die in the stack.

15. A die for implementation in a stack of dies, the die comprising:
- a first input at a first side of the die, the first input configured to receive a die parity signal from a previous die in the stack;
- a first output at a second side of the die opposite the first side, the first output configured to couple to the first input of a next die in the stack;
- a first inverter disposed along a signal path between the first input and the first output, the first inverter configured to invert a logic state of the die parity signal as received at the first input and to provide the die parity signal with the inverted logic state to the first output; and
- parity determination logic having an input coupled to the first input and an output to provide a type signal having a logic state based on the logic state of the die parity signal as received at the first input, wherein the logic state of the type signal identifies the die as either a first type or a second type.

16. The die of claim 15, further comprising:
signal formatting logic configured to selectively invert a logic state of a signal before providing the signal to circuitry of the die, the signal formatting logic to selectively invert the logic state responsive to whether the die is designated as the first type or the second type.

17. The die of claim 16, further comprising:
a second input at the first side of the die, the second input configured to receive an inter-die signal from a previous die in the stack;
a second output at the second side of the die, the second output configured to couple to the second input of a next die in the stack;
a second inverter disposed along a signal path between the second input and the second output, the first inverter configured to invert a logic state of the inter-die signal as received at the second input and to provide the inter-die signal with the inverted logic state to the second output; and
wherein the signal provided to the circuitry of the die comprises the inter-die signal received at the second input of the die and with a logic state that is selectively inverted responsive to whether the die is designated as the first type of the second type.

18. The die of claim 17, further comprising:
signal formatting logic configured to selectively invert a logic state of the inter-die signal as received at the second input before providing the inter-die signal to the circuitry of the die, the signal formatting logic to selectively invert the logic state responsive to whether the die is designated as the first type or the second type, and wherein the signal formatting logic comprises:
a third input configured to receive a representation of the inter-die signal as received at the second input of the die; and
a multiplexer having a first input to receive the representation of the inter-die signal, a second input to receive an inverted representation of the inter-die signal, an output coupled to circuitry of the die, and a select input coupled to the output of the parity determination logic of the die, wherein the multiplexer is configured to output one of the representation of the inter-die signal or the inverted representation of the inter-die signal to the output of the multiplexer responsive to the logic state of the type signal.

19. The die of claim 18, wherein the signal formatting logic at each die further includes:
a programmable delay circuit having an input coupled to the second input to receive the inter-die signal and an output coupled to the third input, and wherein the programmable delay circuit is configured to provide the representation of the inter-die signal to the third input with an introduced programmable delay, wherein the introduced programmable delay is based on a position of the die within the stack.

20. The die of claim 15, wherein the parity determination logic comprises:
an inverter having an input coupled to the first input to receive the die parity signal and an output to provide the type signal as an inverted representation of a logic state of the die parity signal as received at the first input.

* * * * *

UNITED STATES PATENT AND TRADEMARK OFFICE
CERTIFICATE OF CORRECTION

PATENT NO. : 11,356,093 B2  
APPLICATION NO. : 16/817976  
DATED : June 7, 2022  
INVENTOR(S) : Russell Schreiber

Page 1 of 1

It is certified that error appears in the above-identified patent and that said Letters Patent is hereby corrected as shown below:

In the Claims

At Column 15 Line 27, please replace "of" after type and before the with "or"

Signed and Sealed this  
Seventh Day of March, 2023

Katherine Kelly Vidal  
*Director of the United States Patent and Trademark Office*